US010236074B1

(12) United States Patent
Dudley

(10) Patent No.: US 10,236,074 B1
(45) Date of Patent: Mar. 19, 2019

(54) CIRCUITS FOR AND METHODS OF MAKING MEASUREMENTS IN A TESTING ARRANGEMENT HAVING A PLURALITY OF DEVICES UNDER TEST

(71) Applicant: Xilinx, Inc., San Jose, CA (US)

(72) Inventor: Rick W. Dudley, San Jose, CA (US)

(73) Assignee: XILINX, INC., San Jose, CA (US)

( * ) Notice: Subject to any disclaimer, the term of this patent is extended or adjusted under 35 U.S.C. 154(b) by 13 days.

(21) Appl. No.: 15/594,331

(22) Filed: May 12, 2017

(51) Int. Cl.
*G11C 29/00* (2006.01)
*G01R 31/28* (2006.01)
*G11C 7/00* (2006.01)

(52) U.S. Cl.
CPC .......... *G11C 29/00* (2013.01); *G01R 31/2882* (2013.01); *G11C 7/00* (2013.01)

(58) Field of Classification Search
CPC .................................................. G01R 31/2882
See application file for complete search history.

(56) References Cited

U.S. PATENT DOCUMENTS

| 6,023,777 | A * | 2/2000 | Knaack | ............... | G11C 29/003 |
| | | | | | 365/201 |
| 6,594,797 | B1 | 7/2003 | Dudley et al. | | |
| 9,222,976 | B1 | 12/2015 | Usgaonkar | | |
| 9,372,948 | B1 | 6/2016 | Savithri | | |
| 9,500,700 | B1 | 11/2016 | Wang et al. | | |
| 2002/0099987 | A1 * | 7/2002 | Corbin | ................. | G11C 7/1066 |
| | | | | | 714/718 |
| 2005/0102589 | A1 * | 5/2005 | Park | ....................... | G11C 29/56 |
| | | | | | 714/718 |
| 2011/0115468 | A1 * | 5/2011 | Kantake | ........... | G01R 31/31922 |
| | | | | | 324/76.77 |
| 2011/0121814 | A1 * | 5/2011 | Uematsu | .......... | G01R 31/31725 |
| | | | | | 324/76.11 |

* cited by examiner

*Primary Examiner* — Ajay Ojha
(74) *Attorney, Agent, or Firm* — John J. King

(57) ABSTRACT

A method of making measurements in a testing arrangement having a plurality of devices under test is described. The method comprises configuring a device interface board with the plurality of devices under test; running a set of test vectors in a plurality of loops on each device under test of the plurality of devices under test, wherein the set of test vectors is run in parallel on the plurality of devices under test and comprises edge shifted test vectors which are shifted by a predetermined edge shift step during each loop; receiving test result data for the plurality of devices under test; and determining, for each device under test, fail information to identify when the device under test failed based upon a number of edge shift steps. A system for making measurements in a testing arrangement having a plurality of devices under test is also described.

20 Claims, 5 Drawing Sheets

CIRCUITS FOR AND METHODS OF MAKING MEASUREMENTS IN A TESTING ARRANGEMENT HAVING A PLURALITY OF DEVICES UNDER TEST

FIELD OF THE INVENTION

The present invention relates generally to integrated circuits, and in particular, to circuits for and methods of testing an integrated circuit.

BACKGROUND OF THE INVENTION

Pin-to-pin measurements enable measuring various timing parameters of device pins for an integrated circuit device. With regards to a clock signal, pin-to-pin measurements enable setup measurements which measure the time before a clock edge occurs when the data must be valid, a hold measurement which measures the time the data must be valid after the clock edge occurs, a clock-to-output measurement which measures the time from clock-to-output pin changing, a minimum pulse width measurement which measures a minimum pulse width that can be used and still have a clock edge occur, and a straight delay time such as a propagation time measuring the time from the input changing to an output changing, for example.

Traditional methods of acquiring pin-to-pin measurements require the movement of the appropriate edges of a signal and then testing to see if the new timing passes or fails. According to one conventional method of acquiring point-to-point measurements, a binary search could be performed, where half of a search range is eliminated with each test. However, the use of a binary search in point-to-point measurements can lead to problems and has a number of drawback. For example, it is necessary to set timing manually many times, which may be time consuming. It is also necessary that vectors run multiple times, depending on number of cycles to be run, which can also take significant test time. Also, the binary search may not be easily modified to test multiple devices under test (DUTs), which may also be called sites, in parallel. That is, it is necessary to track pass/fail values for each DUT and determine when the testing is complete. A binary search is also commonly done as a serial test for each active DUT, where it is necessary to test each DUT independently.

According to another conventional method of acquiring point-to-point measurements, a linear search could be performed. However, a linear search also has a number of drawbacks. For example, it is necessary to set edge timing multiple times and the vectors must be run multiple times, which can be slow. Depending on number of cycles to be run this can take significant test time. Also, a search window must be narrow or a resolution of the test results reduced. That is, a wider window requires more steps to be taken with corresponding additional test time, while a greater resolution also requires more steps to be taken, also resulting in a corresponding additional test time. A small search window requires knowing the approximate results before testing begins, where results may vary greatly with temperature or test conditions.

SUMMARY OF THE INVENTION

A method of making measurements in a testing arrangement having a plurality of devices under test is described. The method comprises configuring a device interface board with the plurality of devices under test; running a set of test vectors in a plurality of loops on each device under test of the plurality of devices under test, wherein the set of test vectors is run in parallel on the plurality of devices under test and comprises edge shifted test vectors which are shifted by a predetermined edge shift step during each loop; receiving test result data for the plurality of devices under test; and determining, for each device under test, fail information to identify when the device under test failed based upon a number of edge shift steps.

A system for making measurements in a testing arrangement having a plurality of devices under test is also described. The system comprises a device interface board having the plurality of devices under test; and a test controller coupled to the device interface board, wherein the test controller: runs a set of test vectors in a plurality of loops on each device under test of the plurality of devices under test, wherein the set of test vectors is run in parallel on the plurality of devices under test and comprise edge shifted test vectors which are shifted by a predetermined edge shift step during each loop; receives test result data for the plurality of devices under test; and determines, for each device under test, fail information to identify when the device under test failed based upon a number of edge shifts.

DETAILED DESCRIPTION OF THE DRAWINGS

The circuits and methods enable the parallel testing of DUTs with reduced test time by implementing edge shifting of test vectors which may represent clock edges applied to the plurality of DUTs in a first stage of testing. The use of edge shifting allows for any number of DUTs to be tested in parallel, where the test vectors may be set to run in a plurality of loops for a given search window, with each loop having a different predetermined edge shift. Once testing of the DUTs is completed for a given search window and edge shift value, search windows and edge shift values may be modified for individual DUTs. Search windows may be shrunk and edge shift values may be reduced to provide for testing at a finer granularity based on the failure analysis results of the initial parallel test, such that more accurate results may be obtained in a shorter period of time.

This is in contrast to a linear search where an edge shift is determined only after analyzing the results of a test vector, such that user intervention is required for each test cycle. This may also be contrasted with a binary search where a search window is divided in half after each test cycle until a point of failure is determined, which may become very time intensive and require several cycles to identify failure.

One aspect of the method enables the use of edge shifting in conjunction with the failing cycle number to determine an edge shift value (representing how many times the edge has been shifted) before failure, and therefore characterizing a pin-to-pin path of a DUT. Because all DUTs are tested in parallel, only about 7% overhead results for each additional DUT added for the processing in a second stage of testing. The circuits and methods avoid strict board layout rules to make sure pins being tested are not located in the same segment of the tester.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
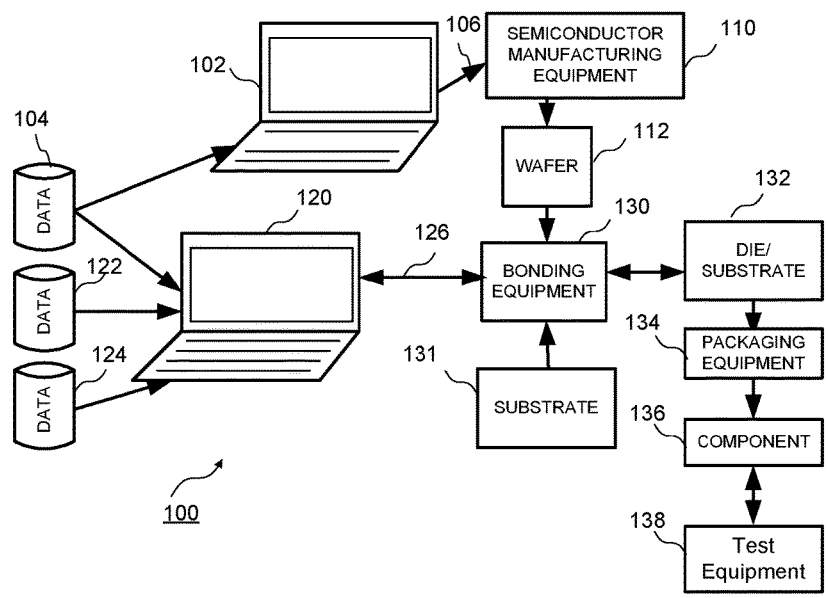
FIG. 1 is a block diagram of a system for producing and testing a component, such as an integrated circuit.

Turning first to FIG. 1, a system for producing and testing an integrated circuit is shown. The system 100 comprises computer aided design (CAD) equipment 102, which could be any computer adapted to run CAD software. The CAD equipment 102 receives data, such as a master pinlist 104, and is coupled by a communication link 106 to semiconductor manufacturing equipment 110. The semiconductor manufacturing equipment 110 generates a wafer 112 having a plurality of die, as is well known in the art.

CAD equipment 120, which is also coupled to receive the master pinlist 104, receives a bonding diagram 122 and substrate artwork 124. The CAD equipment 120 is coupled by a communication link 126 to bonding equipment 130. The communication links 106 and 126 could be any wired or wireless communication link. The bonding equipment generally provides wire bonds from a die from the wafer 112 to a substrate receiving the die. The die/substrate 132 is coupled to packaging equipment 134 which generates a finished component 136, such as an integrated circuit package. Test equipment 138 can be used to test the integrated circuit package, as will be described in more detail below. Although the system of FIG. 1 provides various elements required for producing an integrated circuit package, it should be understood that the elements shown in FIG. 1 could be combined, or additional elements could be provided.

Figure 2:
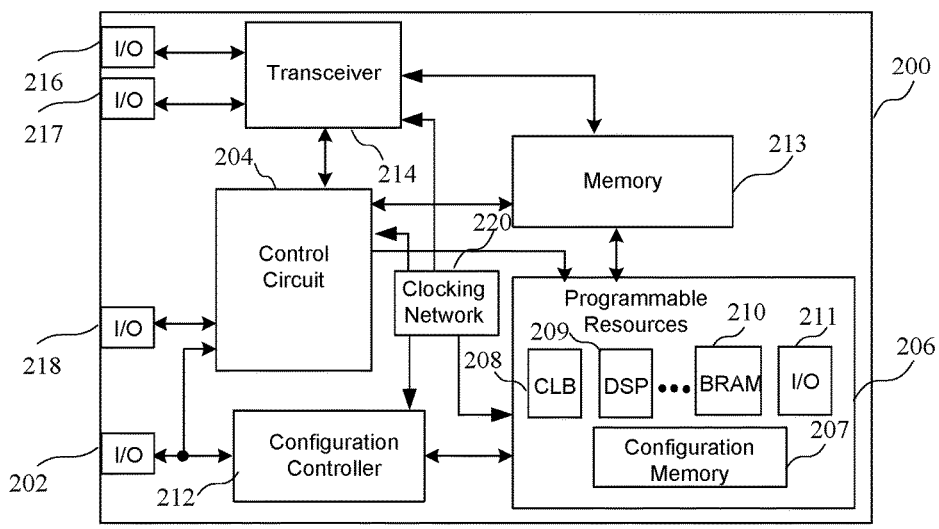
FIG. 2 is a block diagram of an integrated circuit which may be a component that is tested in the system of FIG. 1.

Turning now to FIG. 2, a block diagram of an integrated circuit, such as component 136, is shown. In FIG. 2, a block diagram of an integrated circuit 200 comprising a circuit for transmitting and receiving data in the integrated circuit is shown. In particular, an input/output port 202 is coupled to a control circuit 204 that controls programmable resources 206 having configuration memory 207, configurable logic elements 208, digital signal processing (DSP) blocks 209, blocks of random access memory (BRAMs) 210, and I/O blocks 211. As will be described in more detail below, the various circuit blocks of the programmable resources 206 may be implemented as redundant circuits which may be selected based upon a voltage value of the reference voltage. Configuration data may be provided to the configuration memory 207 by a configuration controller 212. The configuration data enables the operation of the programmable resources 206. A memory 213 may be coupled to the control circuit 204 and the programmable resources 206. A transceiver circuit 214 may be coupled to the control circuit 204, programmable resources 206 and the memory 213, and may receive signals at the integrated circuit by way of I/O pads 216 and 217. Other I/O ports may be coupled to circuits of the integrated circuit device, such as I/O pad 218 that is coupled to the control circuit 104 as shown. A clocking network 220 is coupled to various elements of the circuit of FIG. 2. The circuits and methods set forth below may be implemented using the elements of FIG. 2, such as the I/O pads and transceiver of FIG. 2.

Figure 3:
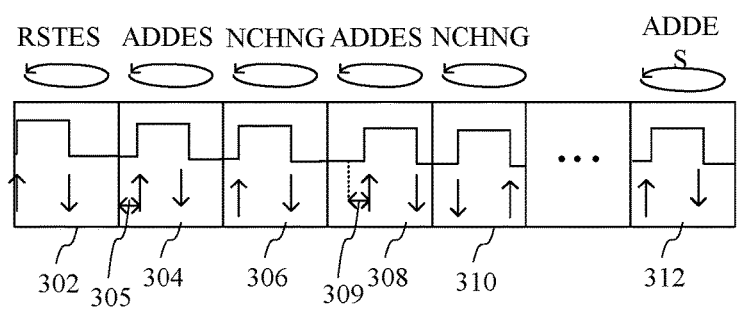
FIG. 3 is timing diagram showing an operation of edge shifting while testing a plurality of devices under test.

Turning now to FIG. 3, a timing diagram shows an operation of edge shifting while testing a plurality of devices under test. As shown in FIG. 3, edge searching may be performed to provide the ability to change edge timing at vector speed, controlled by the vectors. Because different DUTs may fail at different times, binary testing is not generally well suited for testing a plurality of DUTs. Further, rather than running a set of test vectors and then selecting a timing setting to run the test vectors again as in a conventional linear testing, the circuits and methods of the present invention implement edge shifting to allow the testing function to run at vector speed on a plurality of DUTs using a number of predetermined edge shifts. The edges may be shifted, shown here as a forward shift, by a fixed amount as defined by a test program. A set of test vectors are run a plurality of times on a plurality of DUTs, where each running of the set of test vectors is edge shifted such that a rising or falling edge of the test vector is shifted by a known time offset. For example, an initial running 302 of the set of test vectors, designated as a reset set of test vectors (RSTES), is run according to the edge timing shown in the initial running 302 of the set of test vectors, where the circular arrow above the timing pattern indicates that the entire set of test vectors is run. That is, the timing pattern shown in the initial running 302 of the set of test vectors is provided to show the relative locations of edges of the test vectors during a different running of test vectors. For example, as can be seen in the second running 304 of the test vectors, designated as ADDES for having an added edge shift, the set of test vectors is run with an edge shifted by an edge shift step (EDGESHIFTSTEP) 305. The value of the edge shift step may be selected based upon the number of steps that may be required to shift through a search window, as will be described in more detail in reference to FIG. 4.

After each running of a sets of test vectors having an edge shift, it may be beneficial to run the set of vectors 306 without an edge shift (designated as having no change in an edge shift (NCHNG)) to ensure that the timing is accurate. Another running 308 of the test vectors with another edge shift step 309 is implemented, followed by another running 310 of test vectors having no additional edge shift. The vectors are continued to run until a loop count associated with a final set of vectors is reached, such as with a running 312 of the test vectors. A method of making measurements using a plurality of devices under test implementing edge shifting, will be described in more detail below in FIGS. 4 and 5.

Figure 4:
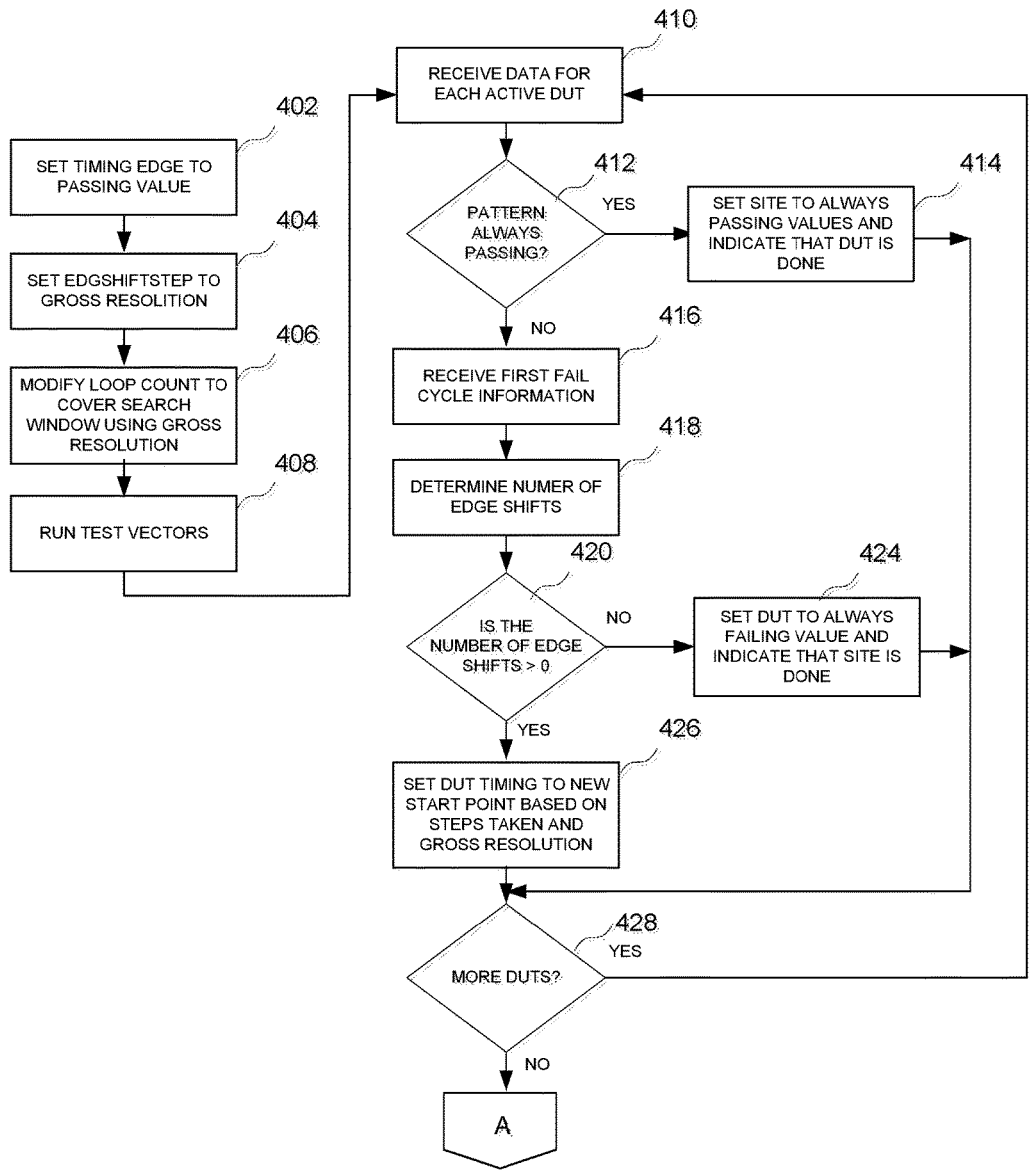
FIG. 4 is a flow chart showing a first portion of a method of edge shifting enabling a gross resolution test.

Turning now to FIG. 4, a flow chart shows a first portion of a method of edge shifting. The first portion of the method may implement coarse or gross resolution of a testing process implemented on a plurality of DUTs, where a fine resolution may be implemented on the plurality of DUTs after the gross resolution testing as described below in reference to FIG. 5. That is, in both gross resolution testing and fine resolution testing, the plurality of DUTs may be tested using the same set of vectors and edge shift values. A timing edge is set to a passing value at a block 402. That is, the timing edge of the test vectors may be set as an initial value that allows all DUTs to pass when run using those test vectors. An edge shift step, designated as EDGESHIFTS-TEP associated with a gross resolution, is set at a block 404. The edge shift step can be selected based upon a number of factors, including for example the size of the window being tested and how many steps should be taken while running the test vectors within the window. A loop count is then modified to cover a search window using a gross resolution at a block 406. The loop count may be set based upon the size of the edge shift step and the size of the search window, where the search window is large enough to allow for the number of shifts that may be necessary for the test vectors to fail. Test vectors are then run at a block 408, and data for each active DUT are then received at a block 410. Accordingly, the first stage of the testing from blocks 402-410 is a more time consuming stage than a second stage, which individually analyzes the results of the test vectors for each of the DUTs. However, because the plurality of DUTs are tested in parallel, the testing may be more efficient than when testing using conventional techniques, such as using binary searching or linear searching of individual DUTs.

In the second stage where test data associated with DUTs may be sequentially analyzed and where the analysis of the test data is performed per DUT, it is determined whether a test vector pattern is always passing at a block 412. If so, the DUT is set to always passing values and indicate that the DUT is done. That is, such a situation when a test vector pattern is always passing indicates that there is likely a problem with the testing process because the edge shift step and the number of loops are set to ensure that the edge shifting would result in a failure of the test vector pattern. If the test vector pattern fails for an edge shift value run during the gross resolution test, first fail cycle information is received at a block 416, and a number of edge shifts that have occurred before failure are determined at a block 418. It is then determined whether the number of edge shifts that have occurred before a failure is greater than 0 at a block 420. If not, the DUT is set to always failing and the DUT is indicated as being done at a block 424. Testing will likely pass through a number of edge steps before a failure is detected. If the number of edge steps is not greater than zero, there may be a problem with a set up of the test equipment.

If the number of edge shifts is greater than 0, each DUT timing is set to a new start point based on the number of steps taken and the gross resolution at a block 428. The new start point would be selected to ensure that the point where the failure occurred would be detected during fine resolution testing. By way of example, the new start point would be selected to ensure that a window of approximately one and a half gross resolution edge steps would be tested again to determine a more accurate point where the failure occurred. The DUT timing would indicate when an error occurred, and therefore enable a rating of the particular DUT, depending upon what the vectors were intended to test, such as a set up measurement, a hold measurement, a clock-to-output measurement, a minimum pulse width measurement, or a straight delay time for example. It is then determined if more DUTs to be analyzed are available for testing at a block 428. If so, the test results will again be analyzed based upon data received for another active DUT. If no more DUTs to be analyzed are available, the method may proceed to the flow chart of FIG. 5, where a fine resolution for the timing of an error may be determined.

Figure 5:
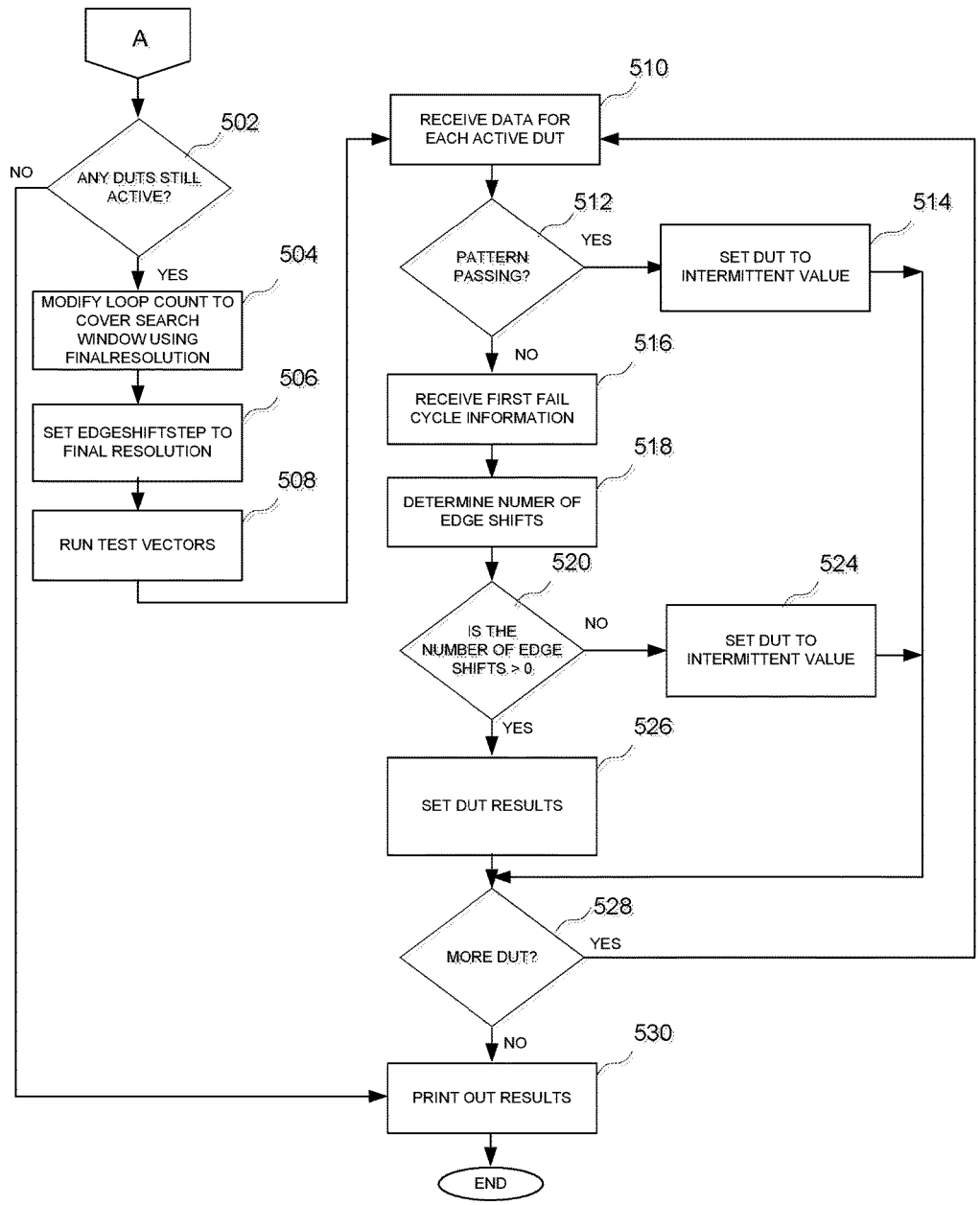
FIG. 5 is a flow chart showing a second portion of a method of edge shifting enabling a fine resolution test.

Turning now to FIG. 5 describing a modified linear edge shift method, a flow chart shows a second portion of edge shifting to enable a fine resolution for determining timing associated with the test vectors. The second portion of the method may implement a fine resolution based upon the DUT timing that is set at block 426. That is, after determining that a failure is detected in a certain cycle at block 426 of FIG. 4, fine resolution edge shifts, which are generally smaller than gross resolution edge shifts performed during gross resolution testing, can be performed from an earlier point in time to more accurately determine the edge shift of the vector that leads to a failure, and therefore accurately provide timing information related to the DUT based upon the test signals of the vector.

It is determined whether there are any DUTs that are still active at a block 502. If so, a loop count is modified to cover a searching window using a fine resolution at a block 504, and an EDGESHIFTSTEP is set to a fine resolution at a block 506. The searching window used during fine resolution testing may be smaller than the searching window used during the gross resolution testing, but is selected to ensure that the point where the failure occurred will fall in the new search window. By way of example, the new search window may be approximately one and a half times the edge shift step for the gross resolution testing, and is selected to ensure that point of failure will fall within the new search window. Test vectors are then run at a block 508, and data for each active DUT are then received at a block 510.

In the second stage of FIG. 5, it is determined whether a test vector pattern is passing at a block 512. If so, the DUT is set to an error value (indicating some intermittency) and indicate that the DUT is done. That is, an error value is used when a valid number of steps is determined in the first stage (i.e. a number of edge shifts is greater than zero indicating that a failure occurred in a gross resolution testing), which may be a result of a pattern or part problem. The error value (indicating some intermittency) would be a value that would not normally occur during the second stage. If the pattern is not passing, second fail cycle information is received at a block 516, and a number of edge shifts (EDGESTEP) are determined at a block 518. It is then determined whether an EDGESTEPS value is greater than 0 at a block 520. If not, the DUT is set to an intermittent value at a block 524. If the number of edge shifts is greater than 0, the DUT results are set at a block 526. It is then determined if more DUTs to be analyzed are available at a block 528. If so, the test results will again be analyzed based upon data received for another active DUT. If there are no active DUTs at block 502 or no more DUTs to be analyzed are available at block 528, results are printed at a block 530.

It should be noted that a linear edge shift can be performed, which can be used when the different DUTs only use a single domain or at the very least all pins involved in the test are in the same domain. If the number of cycles in the verification vectors is large, then an edge shift comprising a modified linear method could be used to reduce test time. That is, small windows or large resolutions can be used, which will essentially enable a linear sweep to find a failing value. An edge shift with a modified linear method may also be implemented, where the method involves using a test method to change the linear search into a modified linear search. The edge shift with a modified linear method does not require all of the test pins to be in the same domain, and handles large cycle count verification vectors. The edge shift with a modified linear method can target to edge shift for a specific waveform table, edge and character. Depending on timing setup, this could result in changing the edge on a specific cycle only.

Figure 6:
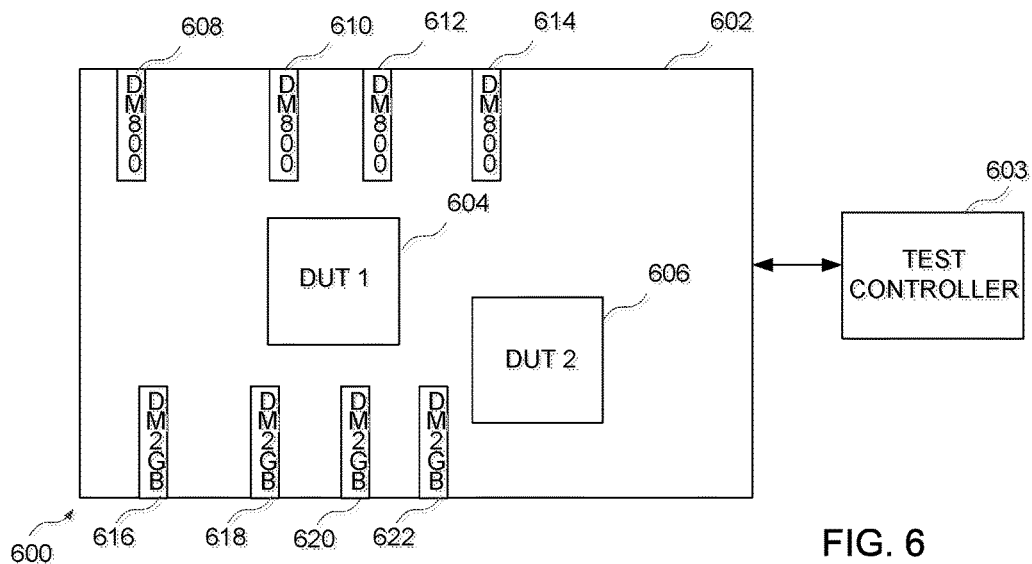
FIG. 6 is a block diagram showing a device interface board having two DUTs under test and a plurality of test cards.

Turning now to FIG. 6, a block diagram shows a system 600 having a device interface board with two DUTs under test. As shown in FIG. 6, a device interface board 602 is coupled to a test controller 603 to enable the testing of a plurality of DUTs, including DUT 1 604 and DUT 2 606. Various test cards having different speeds or operating frequencies may be implement with the device interface board. By way of example, a first set of test cards 608-614, which may have an operating speed of 800 MHz, and a second set of test cards 616-622 which may have an operating speed of 2 GHz. The use the test cards can be optimized by enabling connections to appropriate test cards, and therefore minimizing the use of an high speed test card for a lower speed signal, which could be coupled to a lower speed, lower cost test card. By way of example, a high speed test card may be used for a high speed signal, such as an input signal, while a low speed test card may be used for a low speed signal, such as an output signal. The test controller may comprise a processor circuit enabling the transfer of data between the test controller and the device interface board and enabling the processing of data as described in FIGS. 4-5 and 7. By way of example, the test controller could be implemented using the control circuit 204. However, it should be understood that the control circuit could be any type of processor, such as an ARM processor, an X86 processor, a MIPS processor, a general purpose GPU, or any other processor configured to execute instructions stored in a memory. The control circuit could be implemented in one or more processing devices, where the processors may be different. The processor implements an operating system (OS) that accesses software on the memory and receives various inputs, or one or more integrated circuit devices.

Figure 7:
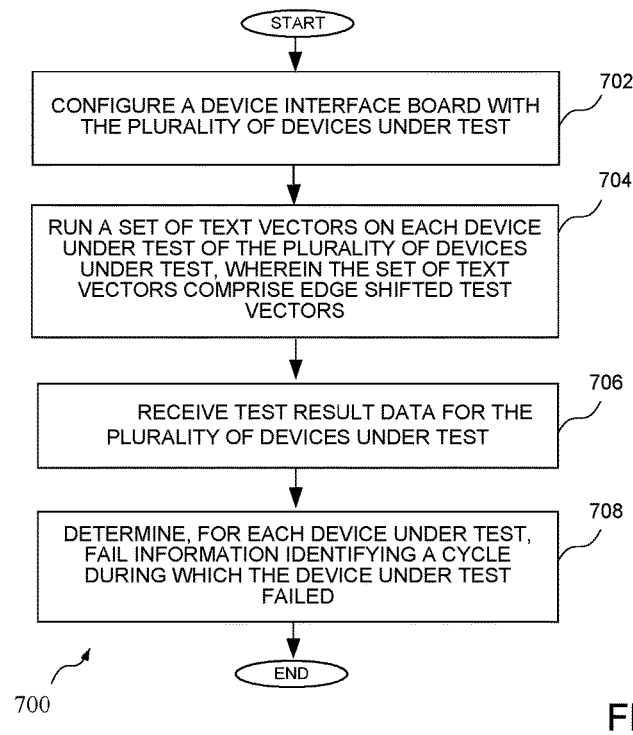
FIG. 7 is a flow chart showing a method making measurements in a testing arrangement having a plurality of devices under test.

Turning now to FIG. 7, a flow chart shows a method making measurements in a testing arrangement having a plurality of DUTs. The method of FIG. 7 may be implemented using the device of FIG. 6 or any other suitable test equipment. More particularly, a device interface board, such as device interface board 602, is configured with the plurality of devices under test at a block 702. A set of test vectors are run on each device under test of the plurality of devices under test, wherein the set of test vectors comprise edge shifted test vectors at a block 704. The set of test vectors may be tested using a test controller, such as test controller 706. Test result data for the plurality of devices under test are received at a block 706. Fail information identifying a cycle during which the device under test failed are determined for each device under test at a block 708.

The method may further comprise initially setting a timing edge of the test vectors to a passing value, and establishing an edge shift step for shifting an edge of a test vector during a gross resolution test. The method may further comprise establishing a loop count to cover a search window based the edge shift step. The method may also set an edge shift step for a fine resolution test, and set a new start point for the fine resolution test after identifying a value of an edge shift during which a device under test failed based upon the gross resolution test. The new start point may be established at an edge shift value before the device under test failed during the gross resolution test. A result for the device under test may be set based upon fail information determined during fine resolution testing. A plurality of test cards comprising different test card types on the device interface board may be implemented, wherein each card type may have a different operating frequency. Running a set of test vectors may comprise running a first set of test vectors at a first operating speed using a first card type and running a second set of test vectors at a second operating speed using a second card type.

In a testing comparison of DUTs tested using different search methods, assuming it takes 3 mS to change a timing edge and 2 mS for functional test overhead in a second stage of the testing, a Binary Search using a 50 nS Window requires 12 steps to get to 15.625 pS. Therefore, the time for testing a single DUT=12*(3 mS+2 mS)=60 mS, while the time for testing 2 DUTs=120 mS. Using a Linear Search, assuming only a 10 nS Window and only 80% of the window is tested, 655 Steps are needed, where the time for testing a single DUT=655 (3 mS+2 mS)=3.275 s and the time for testing 2 DUTs=Single DUT+7%=3.4 s. However, using an edge shift with a Modified Linear method, the time for testing a single DUT=45 mS per measurement on average, while a time for testing 2 DUTs=48 mS per measurement on average. Therefore, using the edge shift with a modified linear method, running dual DUTs requires only about 7% additional test time over the single DUT time.

It can therefore be appreciated that the new and novel circuit for and method of making measurements in a multi-DUT environment has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of making measurements in a testing arrangement having a plurality of devices under test, the method comprising:
configuring a device interface board with the plurality of devices under test;
running a set of test vectors in a plurality of loops on each device under test of the plurality of devices under test during a gross resolution test, wherein the set of test vectors is run in parallel on the plurality of devices under test and comprises edge shifted test vectors which are shifted by a predetermined edge shift step during each loop;
receiving test result data for the plurality of devices under test;
determining, for each device under test, when the device under test failed based upon a number of edge shift steps; and
setting, for each device under test, a start point for a fine resolution test after identifying a value of an edge shift during which a device under test failed based upon the gross resolution test.

2. The method of claim 1 further comprising initially setting a timing edge of the test vectors to a passing value.

3. The method of claim 2 further comprising establishing the predetermined edge shift step for shifting an edge of a test vector during the gross resolution test.

4. The method of claim 3 further comprising establishing a loop count to cover a search window based on the predetermined edge shift step.

5. The method of claim 1 further comprising setting an edge shift step for the fine resolution test.

6. The method of claim 1 wherein the start point for the fine resolution test is established, for each device under test, at an edge shift value before the device under test failed during the gross resolution test.

7. The method of claim 6 further comprising setting a result for the device under test based upon fail information determined during the fine resolution test.

8. The method of claim 1 further comprising implementing a plurality of test cards comprising different test card types on the device interface board, wherein each test card type may have a different operating frequency.

9. The method of claim 1 wherein running a set of test vectors comprises running a first set of test vectors at a first operating speed using a first test card type and running a second set of test vectors at a second operating speed using a second test card type.

10. A system for making measurements in a testing arrangement having a plurality of devices under test, the system comprising:
a device interface board having the plurality of devices under test; and
a test controller coupled to the device interface board, wherein the test controller:
runs a set of test vectors in a plurality of loops on each device under test of the plurality of devices under test during a gross resolution test, wherein the set of test vectors is run in parallel on the plurality of devices under test and comprises edge shifted test vectors which are shifted by a predetermined edge shift step during each loop;
receives test result data for the plurality of devices under test;
determines, for each device under test, when the device under test failed based upon a number of edge shift steps; and
sets, for each device under test, a start point for a fine resolution test after identifying a value of an edge shift during which a device under test failed based upon the gross resolution test.

11. The system of claim 10 wherein the test controller further initially sets a timing edge of the test vectors to a passing value.

12. The system of claim 11 wherein the test controller further establishes the predetermined edge shift step for the gross resolution test.

13. The system of claim 12 wherein the test controller further establishes a loop count to cover a search window based on the predetermined edge shift step.

14. The system of claim 10 wherein the test controller sets an edge shift step for the fine resolution test.

15. The system of claim 10 wherein the start point for the fine resolution test is established, for each device under test, at an edge shift before the device under test failed during the gross resolution test.

16. The system of claim 15 wherein the test controller further sets a result for the device under test based upon fail information determined during the fine resolution test.

17. The system of claim 10 wherein the test controller further implements a plurality of test cards comprising a different test cards types on the device interface board, wherein each test card type may have a different operating frequency.

18. The system of claim 10 wherein running a set of test vectors comprises running a first set of test vectors at a first operating speed using a first test card type and running a second set of test vectors at a second operating speed using a second test card type.

19. A method of making measurements in a testing arrangement having a plurality of devices under test, the method comprising:
configuring a device interface board with the plurality of devices under test;
running a set of test vectors in a plurality of loops on each device under test of the plurality of devices under test, wherein the set of test vectors is run in parallel on the plurality of devices under test and comprises edge shifted test vectors which are shifted by a predetermined edge shift step during each loop;
receiving test result data for the plurality of devices under test; and
determining, for each device under test, when the device under test failed based upon a number of edge shift steps;
wherein running a set of test vectors comprises running a first set of test vectors at a first operating speed using a first card type and running a second set of test vectors at a second operating speed using a second card type.

20. The method of claim 19 further comprising initially setting a timing edge of the test vectors to a passing value, and establishing the predetermined edge shift step for shifting an edge of a test vector during the gross resolution test.

* * * * *